United States Patent
Tashima et al.

(10) Patent No.: US 7,477,530 B2
(45) Date of Patent: Jan. 13, 2009

(54) FREQUENCY CONVERTING APPARATUS AND CONTROL METHOD FOR THE APPARATUS

(75) Inventors: Kiyomi Tashima, Funabashi (JP); Norinaga Suzuki, Katori (JP)

(73) Assignee: Hitachi Industrial Equipment Systems Co., Tokyo (JP)

( * ) Notice: Subject to any disclaimer, the term of this patent is extended or adjusted under 35 U.S.C. 154(b) by 288 days.

(21) Appl. No.: 11/508,859

(22) Filed: Aug. 24, 2006

(65) Prior Publication Data

US 2007/0147100 A1    Jun. 28, 2007

(30) Foreign Application Priority Data

Dec. 28, 2005    (JP) ............................. 2005-376961

(51) Int. Cl.
*H05K 7/20* (2006.01)
*H02M 5/40* (2006.01)

(52) U.S. Cl. ..................... 363/34; 363/141; 361/678; 361/695

(58) Field of Classification Search ............... 363/34, 363/35, 36, 37, 125, 131, 132, 141; 361/678, 361/695

See application file for complete search history.

(56) References Cited

U.S. PATENT DOCUMENTS

| | | | | |
|---|---|---|---|---|
| 4,527,214 | A | * | 7/1985 | Hattori et al. .................. 361/96 |
| 4,651,266 | A | * | 3/1987 | Fujioka et al. ................. 363/39 |
| 4,772,996 | A | * | 9/1988 | Hanei et al. .................... 363/41 |
| 5,905,647 | A | * | 5/1999 | Shirai .......................... 363/141 |
| 6,236,184 | B1 | | 5/2001 | Baker |
| 6,327,165 | B1 | * | 12/2001 | Yamane et al. .............. 363/132 |
| 7,023,712 | B2 | * | 4/2006 | Miettinen ..................... 363/34 |

FOREIGN PATENT DOCUMENTS

| | | |
|---|---|---|
| JP | 2003-18861 | 1/2003 |
| JP | 2005-287214 | 10/2005 |

* cited by examiner

*Primary Examiner*—Gary L Laxton
(74) *Attorney, Agent, or Firm*—Antonelli, Terry, Stout & Kraus, LLP.

(57) ABSTRACT

The difference between internal processes of a power converting apparatus may bring about a heat difference in the apparatus. In the cooling process, it is presumed that the temperature change of the inverter or converter module may be made so great that the power converting apparatus may be less reliable. In order to overcome this shortcoming, the temperature of the internal module is measured and a cooling control of a cooling fan or the like is carried out on the measured result. This cooling control of the cooling fan causes the life of a switching element of the inverter or converter to be longer.

5 Claims, 4 Drawing Sheets

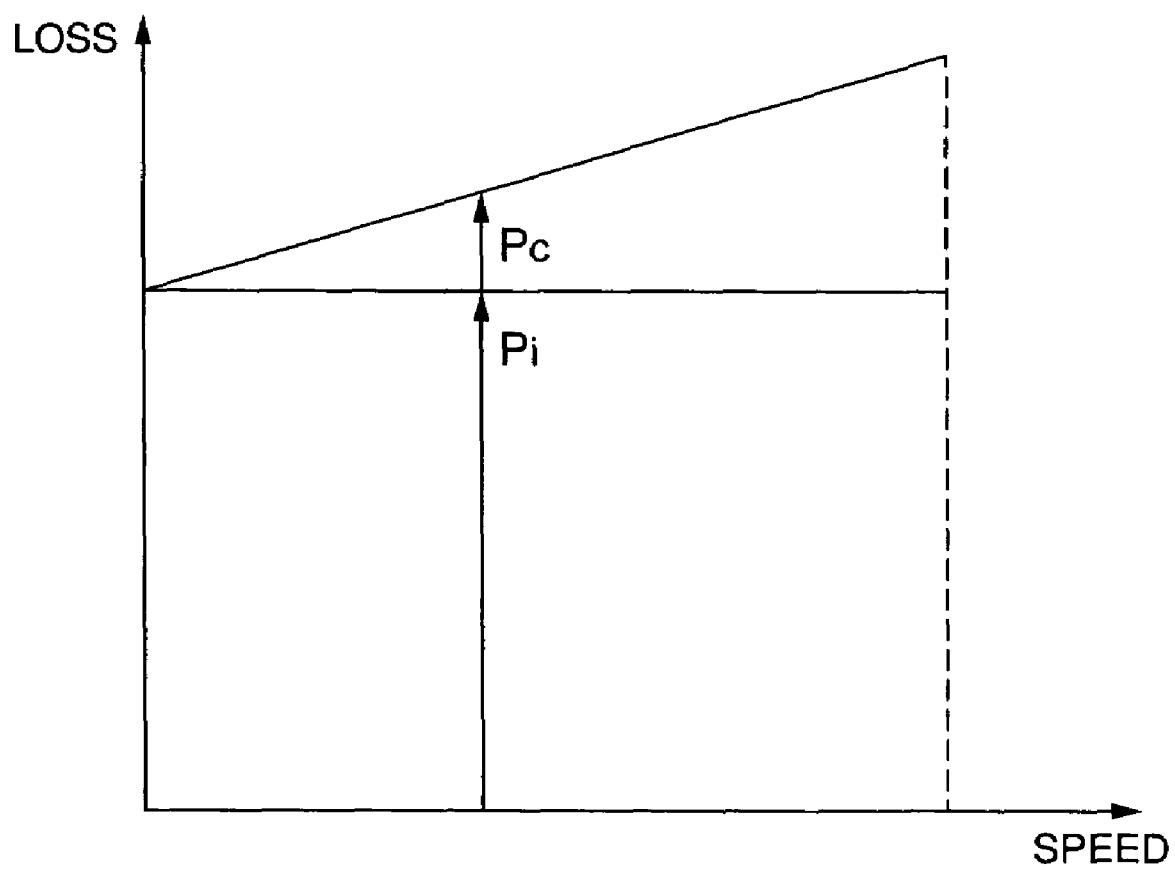

FREQUENCY CONVERTING APPARATUS AND CONTROL METHOD FOR THE APPARATUS

INCORPORATION BY REFERENCE

The present application claims priority from Japanese application JP2005-376961 filed on Dec. 28, 2005, the content of which is hereby incorporated by reference into this application.

BACKGROUND OF THE INVENTION

1. Field of the Invention

The present invention relates to a technology of providing a power converting apparatus.

2. Related Art

In general, the power converting apparatus provides a capability of lowering heat emitted from a power converting element through the effect of cooling fins when an electric power is converted from an ac (alternating current) power to a dc (direct current) power or vice versa. This technology is described in JP-A-2005-287214.

SUMMARY OF THE INVENTION

The technology of JP-A-2005-287214 is arranged to lower the heat emitted from the element through the cooling fan.

In the meantime, as to the power conversion between an ac power and a dc power, concretely, a device called a converter is used for the conversion from an ac power to a dc power, while a device called an inverter is used for the conversion fro a dc power to an ac power.

The characteristic of the heating occurring in the inverter and the converter is illustrated in FIG. 5.

FIG. 5 shows relation between a speed occurring when the power converting apparatus controls the speed of a motor at a constant torque characteristic and losses of the inverter and the converter.

In FIG. 5, Pi denotes a loss of the inverter. Pc denotes a loss of the converter. As shown in FIG. 5, if the speed of the motor is changed, the loss Pi of the inverter is kept substantially constant. On the other hand, the loss Pc of the converter is being varied substantially in proportion to the speed change of the motor. It is understood from FIG. 5 that the change of the loss Pi of the inverter is greatly different from the change of the loss Pc of the converter.

As such, it is presumed that the difference of the loss change between the inverter and the converter may bring about a shortcoming when the foregoing operation of lowering the heat.

For example, consider that the cooling operation is carried out in correspondence to the temperature change of the inverter. The loss Pi of the inverter is kept substantially constant even if the speed of the motor is changed. Hence, if a greater loss Pc of the converter takes place in proportion to the speed, the greater loss Pc may be overlooked. In this case, the temperature of the converter may be raised.

Further, the inverter and the converter may provide a switching element therefor. When the temperature of the switching element exceeds an allowable value or comes closer to so high a value as the allowable value, the life of the switching element is likely to be shorter.

Further, it is known that the life of the switching element is likely to be shorter if the temperature change of the switching element is great. Further, in a case that the switching element is secured onto a substrate or the like by soldering, if the temperature change of the switching element is great, it is known that the difference of a coefficient of expansion between the switching element and the substrate may cause the fixing of the switching element to the substrate or the like to be incomplete, such as cracks of the soldering. (This phenomenon may be called a power cycle life-time.)

Since this phenomenon causes the change of the loss magnitude to be greatly different between the inverter and the converter, it is presumed that one of the inverter and the converter may be life-expired earlier.

The present invention is made to overcome the foregoing shortcoming caused in the cooling operation.

In order to overcome this shortcoming, the temperatures of the inverter and the converter are differently estimated.

This temperature estimation is carried out by using the output current in accordance with the following characteristic.

In general, a constant torque characteristic, or, if a load characteristic is grasped, a loss of the converter or the inverter is represented by the following expression.

[Converter Loss]=$\alpha c$×[Output Current×Frequency]   (expression 1)

[Inverter Loss]=$\alpha i$×[Output Current]   (expression 2)

Hence, by detecting the output current, at first, the inverter loss can be obtained from a product of the output current and the proportion constant $\alpha i$.

Then, the converter loss can be obtained from a product of the output current, the frequency and the proportion constant $\alpha c$.

The temperatures of the inverter and the converter may be estimated from these inverter loss and converter loss.

The output current can be detected by using a current sensor such as the Hall element and the Shunt resistor.

In addition, since the frequency is a parameter used in a control unit for controlling an inverting unit, the frequency can be easily obtained.

As described above, by obtaining the inverter loss and the converter loss from the output current, a temperature sensor may be removed from the overall arrangement. Of course, the temperature sensor may be used. At first, the temperature is measured when the power converting apparatus is started and is stored as a value given when the apparatus is started. Then, the difference is obtained between the temperature measured at any time when the apparatus is driven and the temperature measured when the apparatus is started. If the different is greater than the predetermined value, the cooling fan is controlled so that the cooling fins of the converter or the inverter may be cooled down. As a result, the cooling fins are cooled down and thus the converter or the inverter is cooled down.

In particular, the power converting apparatus may be arranged so that the temperature of the converter may be estimated. Hence, the change of the temperature of the converter may be made smaller than the conventional change.

For the purpose of making the temperature change smaller than the conventional change, simply by dissipating the heat with the cooling fan, the temperature rise may be made smaller. In other words, the simple way is used. The amount of dissipated heat is made greater and greater than the amount of heat occurring in the converter, the inverter or the heating portion located inside the power converting apparatus. This way causes the temperature rise to be smaller.

However, without being limited to the foregoing arrangement, for example, in a case that the difference between the predetermined target temperature and the detected temperature is so great, the temperature may be controlled to be greatly lower by the cooling operation, while in a case that the difference between the target temperature and the detected temperature is not so great, the temperature may be controlled not to be lower so much.

For example, in the converter loss Pi of FIG. 5, when the speed is fast (the frequency is high), by controlling the temperature to be so much lower by the cooling operation of the cooling fan or the like, the temperature rise of the converter may be greatly reduced. As a result, in FIG. 5, the converter loss Pi in the area where the speed is fast is changed in the direction of lowering the loss Pi.

On the other hand, when the speed is slow (the frequency is low), by controlling the temperature not to be lower so much by the cooling operation of the cooling fan or the like, the reduction of the temperature rise of the converter is made smaller. In this case, the temperature of the converter may be apparently made higher. As a result, it is viewed in FIG. 5 that the converter loss Pi in the area where the speed is slow is changed in the direction of lowering the loss Pi.

As stated above, in a case that the foregoing control causes the converter temperature to be lower in the area where the speed is fast or the converter temperature to be apparently higher, generally, the gradient of the temperature change caused by the converter loss Pi in FIG. 5 may be made smaller. This makes it possible to lower the temperature change band of the converter.

In addition, for cooling the cooling fins, the cooling fan may be used. Instead, the water cooling or the oil cooling may be used.

As to the temperature estimation, the temperature of a module located in the inverter or the converter may be measured. Or, the temperature of the cooling fins loaded in the inverter or the converter may be measured.

Further, as to the control of the cooling fan and the predetermined value about the concerned control, the temperature of a joint of the elements loaded in the inverter and the converter may be used as the temperature-estimated results of the inverter and the converter.

The foregoing control allows the power converting apparatus of the present invention to be more reliable than the conventional apparatus.

Other objects, features and advantages of the invention will become apparent from the following description of the embodiments of the invention taken in conjunction with the accompanying drawings.

BRIEF DESCRIPTION OF THE DRAWINGS

FIG. 5 is a chart showing relation between the speed occurring when the conventional power converting apparatus controls the speed of its motor at a constant torque characteristic, the inverter loss and the converter loss.

DESCRIPTION OF THE EMBODIMENTS

The embodiments of the present invention will be described below with reference to the appended drawings.

First Embodiment

Figure 1:
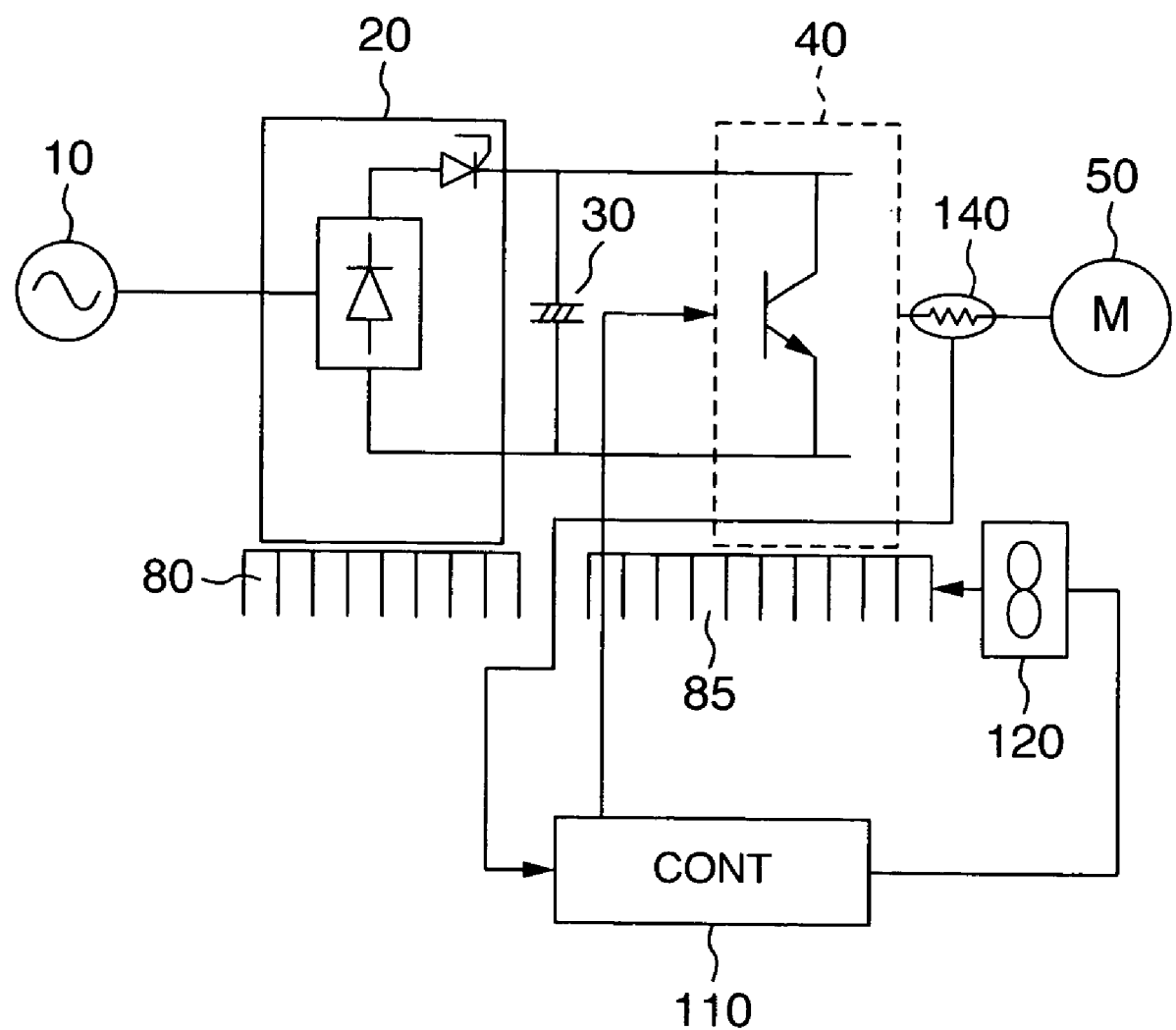
FIG. 1 is a circuit diagram showing an arrangement of a power converting apparatus according to an embodiment of the present invention.

FIG. 1 is an explanatory circuit diagram showing an arrangement of the first embodiment of the present invention.

In FIG. 1, an ac power supplied from a commercial power supply 10 is converted into a dc power through a converter 20. The dc power is smoothed in a smoothing unit 30. Then, the smoothed power is converted into an ac power through an inverter 40. Then, the resulting ac power is supplied to a motor 50 served as a load. A control unit 110 controls the conversion of the dc power into the ac power trough the inverter 40. For example, this control is a so-called PWM control.

Further, in the arrangement shown in FIG. 1, the converter 20 provides cooling fins 80 through which heat is dissipated.

Further, the inverter 40 also provides cooling fins 85 through which heat is scattered out.

Further, a detection signal sent from a current detector 140 is applied into the control unit 110 in which the output current is obtained.

Based on the detected output current value and the frequency that corresponds to a parameter to be processed by the control unit 110, the control unit 110 controls a cooling fan 120 so that air is sent to the cooling fins 80 and 85 for the purpose of scattering out the heat.

In the foregoing operation, the control unit 110 estimates the temperatures of the inverter and the converter by using the above-described expressions 1 and 2.

The control of the cooling fan 120 through this control unit 110 will be described with reference to the flowchart shown in FIG. 2.

Figure 2:
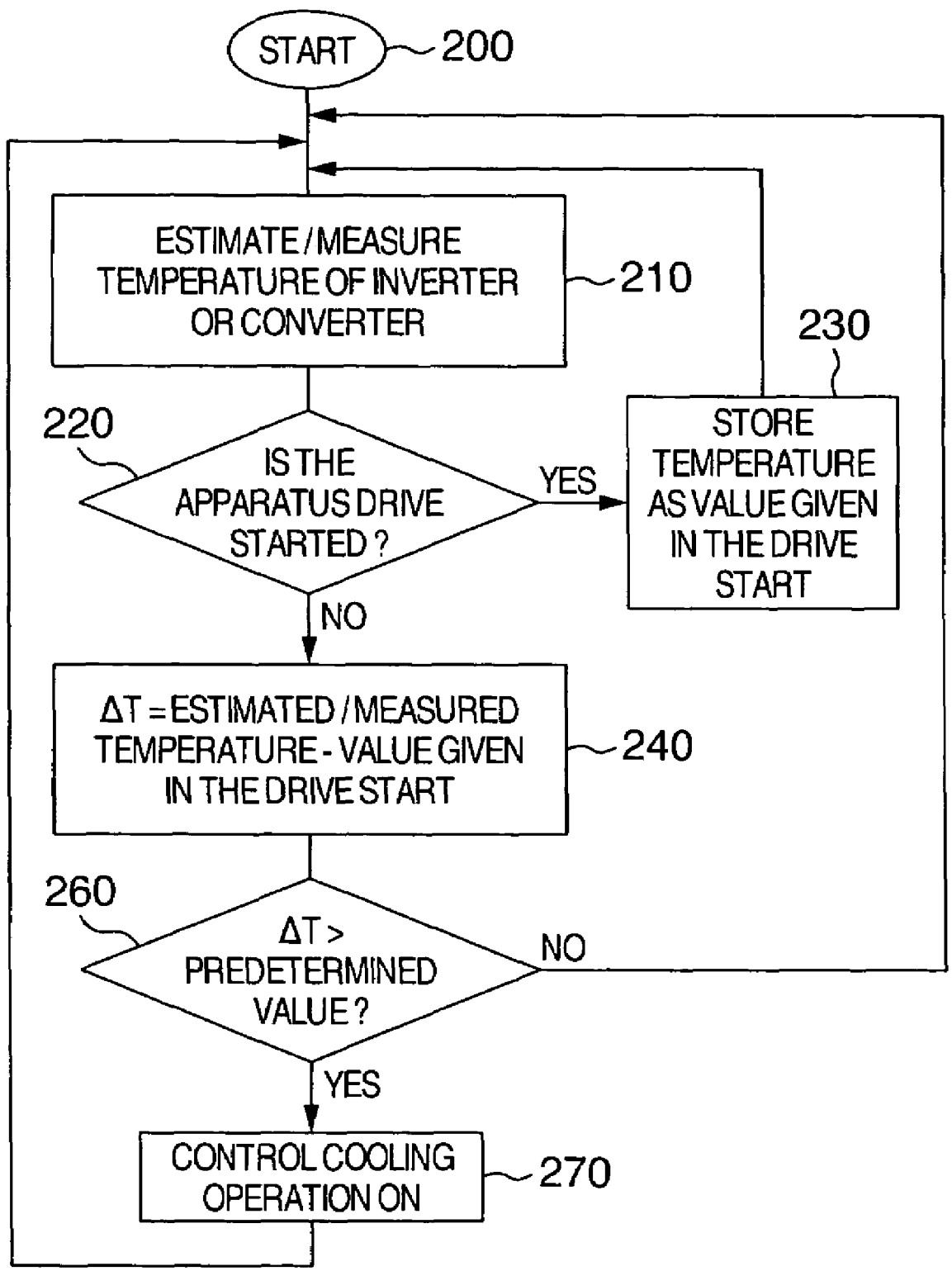
FIG. 2 is a flowchart showing a cooling control of a control unit located in the power converting apparatus according to the embodiment of the present invention.

In FIG. 2, when the control is started (step 200), the operation is executed to estimate or measure the temperature of the inverter or the converter (step 210). Then, if the estimate or measure is executed at the start time of the apparatus (if yes in the step 220, the estimated or measured value is stored as the data at the stat time of the apparatus (step 230). On the other hand, if the estimated or measured value is obtained not when the apparatus is started but after started (if no in the step 220, the operation is executed to derive a difference between this value and the pre-stored value in the start time of the apparatus (step 240).

If this difference is smaller than the predetermined value (if no in the step 260, the operation goes back to the step after the control is started (next to the step 200).

On the other hand, if this difference is greater than the predetermined value (if no in the step 260, the operation is executed to control the cooling fan for cooling the cooling fins (step 270). Then, the operation goes back to the step after the control is started (next to the step 200).

Figure 3:
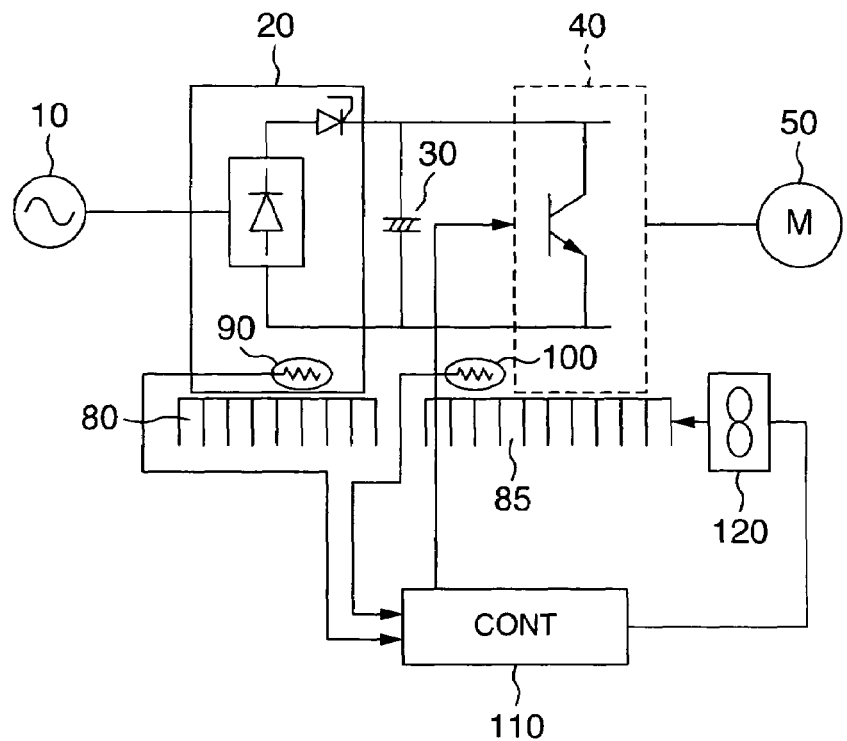
FIG. 3 is a circuit diagram showing an arrangement of a power converting apparatus according to another embodiment of the present invention.

FIG. 3 illustrates the arrangement in which temperature sensors 90, 100 are provided for measuring the temperatures of the inverter and the converter and applying the temperatures into the control unit 110 for the control instead of the estimation of the temperatures of the inverter and the converter based on the output current value as described with respect to the embodiment shown in FIG. 1.

Figure 4:
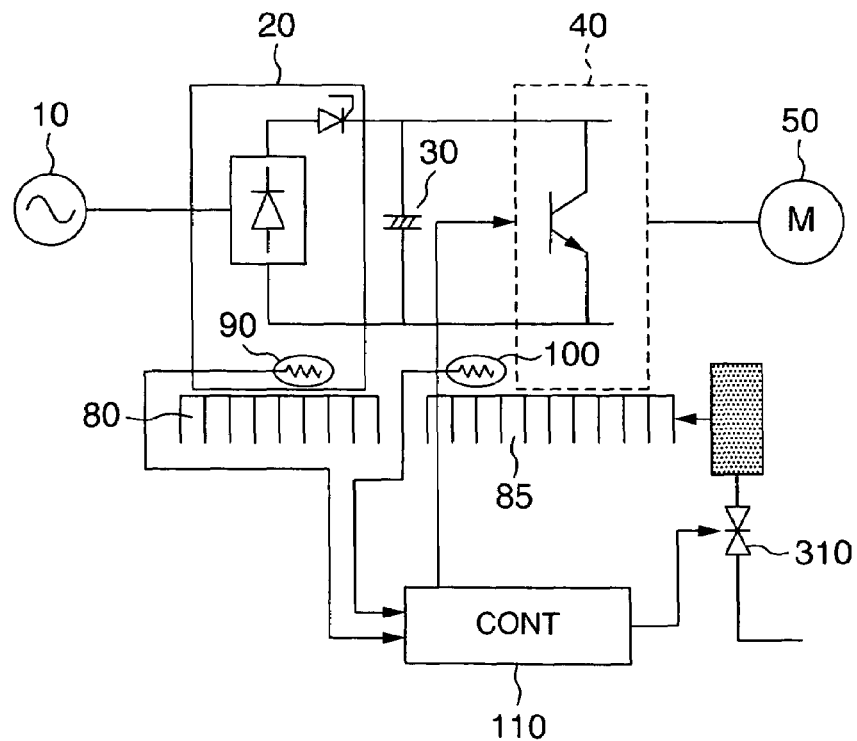
FIG. 4 is a circuit diagram showing an arrangement of the power converting apparatus according to the embodiment in which a water-cooling or an oil-cooling operation is used for cooling the cooling fins.

FIG. 4 illustrates the arrangement in which a water-cooling device or an oil-cooling device 310 is provided instead of the cooling fan 120 described with respect to the embodiment shown in FIG. 1. The other arrangement is the same as that of the embodiment shown in FIG. 1. Then, in the process of the control in FIG. 4, the control of the cooling fan in the step 270 shown in the flowchart of FIG. 2 is replaced with the water-cooling device or the oil-cooling device.

As described above, in this embodiment, in particular, the estimation or measurement of the temperature is executed with respect to the converter. Hence, the changing range of the temperature of the converter may be smaller than the conventional one. For example, this temperature change makes it possible to solve the conventional shortcomings. Moreover, in the foregoing description, the motor is controlled at a constant torque. However, the speed control of the motor is not limited to that. It may be a control at reduced torque or another control.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A power converting apparatus comprising:
   a converter for converting ac power from a commercial power supply into dc power;
   a smoothing unit for smoothing the dc power sent from the converter;
   an inverter for converting an output of said smoothing unit into another ac power;
   a control unit for controlling said inverter;
   a current detector for detecting an output current of said inverter; and
   a cooling fan for cooling said converter and said inverter;
   wherein a detection signal sent from said current detector is inputted into said control unit so that said control unit estimates a temperature of said inverter or converter based on said detection signal and control said cooling fan based on the estimated temperature; and
   wherein said control unit estimates the temperature of said inverter or converter according to the operations of the following expressions;
   Estimation of the temperature of the converter $=\alpha c \times$[the output current $\times$an output frequency],and
   Estimation of the temperature of the inverter $=\alpha i \times$[the output current],
   wherein $\alpha c$ and $\alpha i$ are proportional constants.

2. The power converting apparatus as claimed in claim 1, wherein a water-cooling device is used instead of said cooling fan.

3. The power converting apparatus as claimed in claim 1, wherein an oil-cooling device is used instead of said cooling fan.

4. The power converting apparatus as claimed in claim 1, wherein said current detector uses a Hall element.

5. The power converting apparatus as claimed in claim 1, wherein said current detector uses a shunt resistor.

* * * * *